(12) United States Patent
Wu et al.

(10) Patent No.: US 11,238,912 B1
(45) Date of Patent: Feb. 1, 2022

(54) MAGNETORESISTIVE RANDOM-ACCESS MEMORY

(71) Applicant: UNITED MICROELECTRONICS CORP., Hsin-Chu (TW)

(72) Inventors: Yi-Ting Wu, Tainan (TW);
Cheng-Tung Huang, Kaohsiung (TW);
Jen-Yu Wang, Tainan (TW);
Yung-Ching Hsieh, Tainan (TW);
Po-Chun Yang, Tainan (TW);
Jian-Jhong Chen, Tainan (TW);
Bo-Chang Li, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/146,424

(22) Filed: Jan. 11, 2021

(30) Foreign Application Priority Data

Dec. 17, 2020 (CN) .......................... 202011492376.0

(51) Int. Cl.
*G11C 11/16* (2006.01)
*H01L 27/22* (2006.01)

(52) U.S. Cl.
CPC ........ *G11C 11/1655* (2013.01); *G11C 11/161* (2013.01); *G11C 11/1657* (2013.01); *G11C 11/1659* (2013.01); *H01L 27/228* (2013.01)

(58) Field of Classification Search
CPC .............. G11C 11/1655; G11C 11/161; G11C 11/1657; G11C 11/1659; H01L 27/228
USPC ......................................................... 365/158
See application file for complete search history.

(56) References Cited

U.S. PATENT DOCUMENTS

| 8,681,535 | B2 * | 3/2014 | Shukh ................ G11C 14/0081 |
| | | | 365/154 |
| 10,388,346 | B2 * | 8/2019 | Oka .................... G11C 13/0023 |
| 2018/0025765 | A1 * | 1/2018 | Yokoyama .............. H01L 49/00 |
| | | | 365/158 |
| 2018/0123038 | A1 * | 5/2018 | Lee ......................... H01L 45/06 |

\* cited by examiner

*Primary Examiner* — Connie C Yoha
(74) *Attorney, Agent, or Firm* — Winston Hsu

(57) ABSTRACT

In an MRAM, each unit cell includes two non-volatile storage units, three N-type transistors and three P-type transistors. Each N-type transistor is coupled in parallel with a corresponding P-type transistor for forming a transmission gate which provides bi-directional current, thereby preventing source degeneration.

11 Claims, 9 Drawing Sheets

MAGNETORESISTIVE RANDOM-ACCESS MEMORY

CROSS REFERENCE TO RELATED APPLICATION

This application claims priority of China Application No. 202011492376.0 filed on 2020 Dec. 17.

BACKGROUND OF THE INVENTION

1. Field of the Invention

The present invention is related to a magnetoresistive random-access memory, and more particularly, to a spin torque transfer magnetoresistive random-access memory capable of preventing source degeneration, thereby improving the writing speed and reducing switching voltage.

2. Description of the Prior Art

Traditional memory normally stores data by charging/discharging capacitors, while magnetoresistive random-access memory (MRAM) stores data in magnetic domains. MRAM is characterized in high-speed data transmission, high cell density, light weight, low power consumption and high impact resistance, and thus particularly suitable for implementing on high-end portable electronic products.

A spin torque transfer (STT) MRAM utilizes a magnetic tunnel junction (MTJ) as the memory storage. An MTJ contains two ferromagnetic layers separated by an oxide barrier layer. The magnetization direction of one ferromagnetic layer is fixed while that of the other ferromagnetic layer can be altered by a switching voltage. Magnetization of the free layer is used to store the data and can be switched by spin-polarized electrons.

FIGS. 1A and 1B are diagrams illustrating a prior art STT MRAM 100. The STT MRAM 100 includes a unit cell 10, bit lines BL1-BL2, a word line WL, and a source line SL. The prior art unit cell 10 adopts a 3T2M structure which includes three N-type transistors N1-N3 and two non-volatile storage units MTJ1 and MTJ2. During the operation of writing to the parallel state and anti-parallel state, the write-in current $I_W$ is mainly provided by the N-type transistors N1-N3. When negatively-charged electrons (the majority carriers of the N-type transistors N1-N3) flow from the source end to the drain end of the N-type transistors N1-N3, positive current flows from the drain end to the source end of the N-type transistors N1-N3.

FIG. 1A is a diagram illustrating the operation of writing the non-volatile storage units of the prior art unit cell 10 to a parallel state. When writing the non-volatile storage unit MTJ1 to the parallel state, the bit line BL1 is biased to a positive voltage VDD (such as 0.8V), the source line SL is biased to a ground voltage (such as 0V), and the bit line BL2 is floating. Under such circumstance, the write-in current $I_W$ flows from the bit line BL1 to the source line SL, as depicted by the dotted arrow in FIG. 1A. During the operation of writing to the parallel state in the prior art STT MRAM 100, the non-volatile storage unit MTJ1 is located on the drain ends of the N-type transistors N1-N3, and thus does not cause any source degeneration on the N-type transistors N1-N3.

FIG. 1B is a diagram illustrating the operation of writing the non-volatile storage units of the prior art unit cell 10 to an anti-parallel state. When writing the non-volatile storage unit MTJ1 to the anti-parallel state, the bit line BL1 is biased to a ground voltage (such as 0V), the source line SL is biased to a positive voltage VDD (such as 0.8V), and the bit line BL2 is floating. Under such circumstance, the write-in current $I_W$ flows from the source line SL to the bit line BL1, as depicted by the dotted arrow in FIG. 1B. During the operation of writing to the anti-parallel state in the prior art STT MRAM 100, the non-volatile storage unit MTJ1 is located on the source ends of the N-type transistors N1-N3. The voltage established across the non-volatile storage unit MTJ1 reduces the gate-source voltage of the N-type transistors N1-N3, and thus results in source degeneration which may lower the write-in current $I_W$.

As previously stated, under the same bias condition, the speed of writing to the anti-parallel state in the prior art STT MRAM 100 may be reduced due to smaller write-in current $I_W$ caused by source degeneration. The prior art STT MRAM 100 may need to increase its switching voltage for maintaining high speed when writing to the anti-parallel state. Therefore, there is a need for an STT MRAM capable of preventing source degeneration, thereby improving the writing speed and reducing switching voltage

SUMMARY OF THE INVENTION

The present invention provides a magnetoresistive random-access memory which includes a first bit line, a second bit line; and a unit cell. The unit cell includes first and second non-volatile storage units, first through third N-type transistors, and first through third P-type transistors. The first non-volatile storage unit includes a first end coupled to the first bit line, and a second end. The second non-volatile storage unit includes a first end coupled to the second bit line, and a second end. The first N-type transistor includes a first end coupled to the second end of the first non-volatile storage unit, a second end, and a control end. The second N-type transistor includes a first end coupled to the second end of the second non-volatile storage unit, a second end, and a control end. The third N-type transistor includes a first end coupled to the first end of the first N-type transistor, a second end coupled to the first end of the second N-type transistor, and a control end. The first P-type transistor includes a first end coupled to the second end of the first N-type transistor, a second end coupled to the first end of the first N-type transistor, and a control end. The second P-type transistor includes a first end coupled to the second end of the second N-type transistor, a second end coupled to the first end of the second N-type transistor, and a control end. The third P-type transistor includes a first end coupled to the second end of the third N-type transistor, a second end coupled to the first end of the third N-type transistor, and a control end.

The present invention also provides a magnetoresistive random-access memory which includes an N-type doping region, a P-type doping region, a poly-silicon layer, first through fourth metal layers, a first non-volatile storage unit, and a second non-volatile storage unit. The N-type doping region is formed in a substrate. The P-type doping region is formed in the substrate. The poly-silicon layer is formed on the substrate. The first metal layer is formed on the substrate. The second metal layer is formed above the first metal layer. The first non-volatile storage unit is disposed above the second metal layer and located on a first reference line. The second non-volatile storage unit is disposed above the second metal layer and located on a second reference line parallel to the first reference line. The third metal layer is formed above the first non-volatile storage unit and the second non-volatile storage unit. The fourth metal layer is formed above the third metal layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
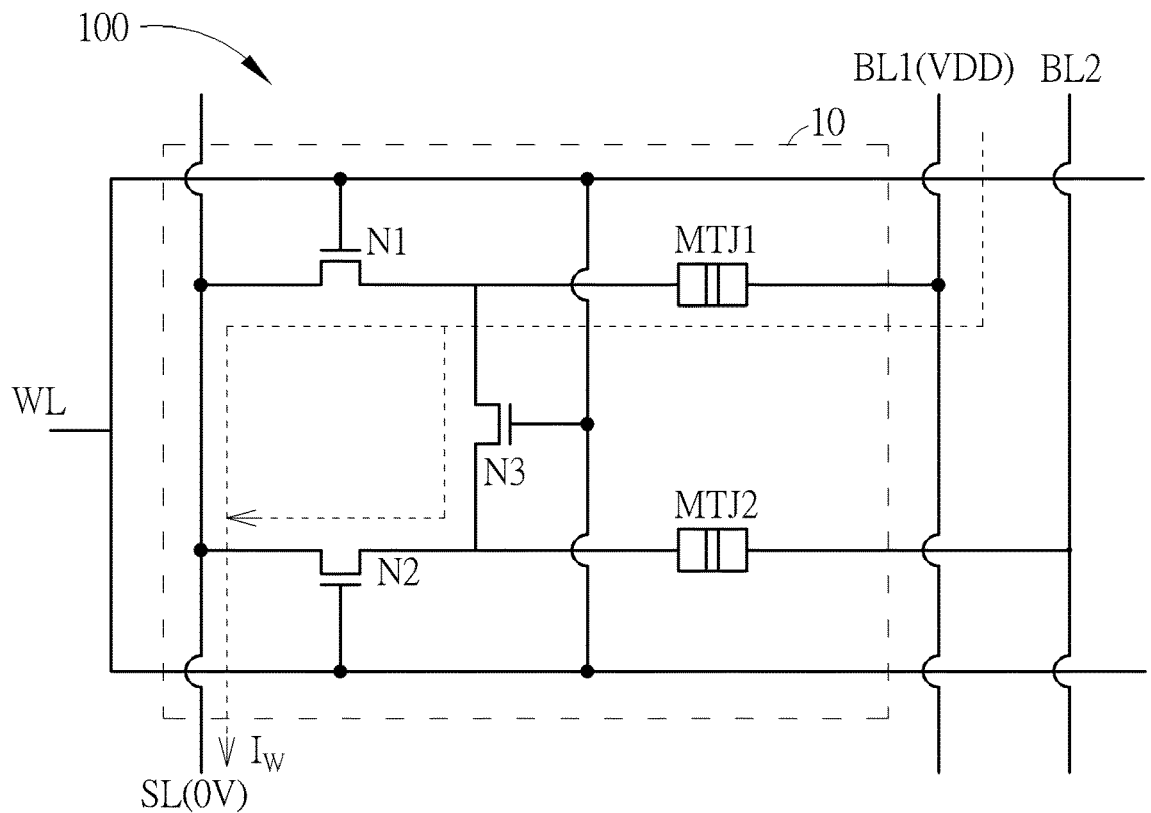
FIGS. 1A and 1B are diagrams illustrating a prior art STT MRAM.
Figure 1B:
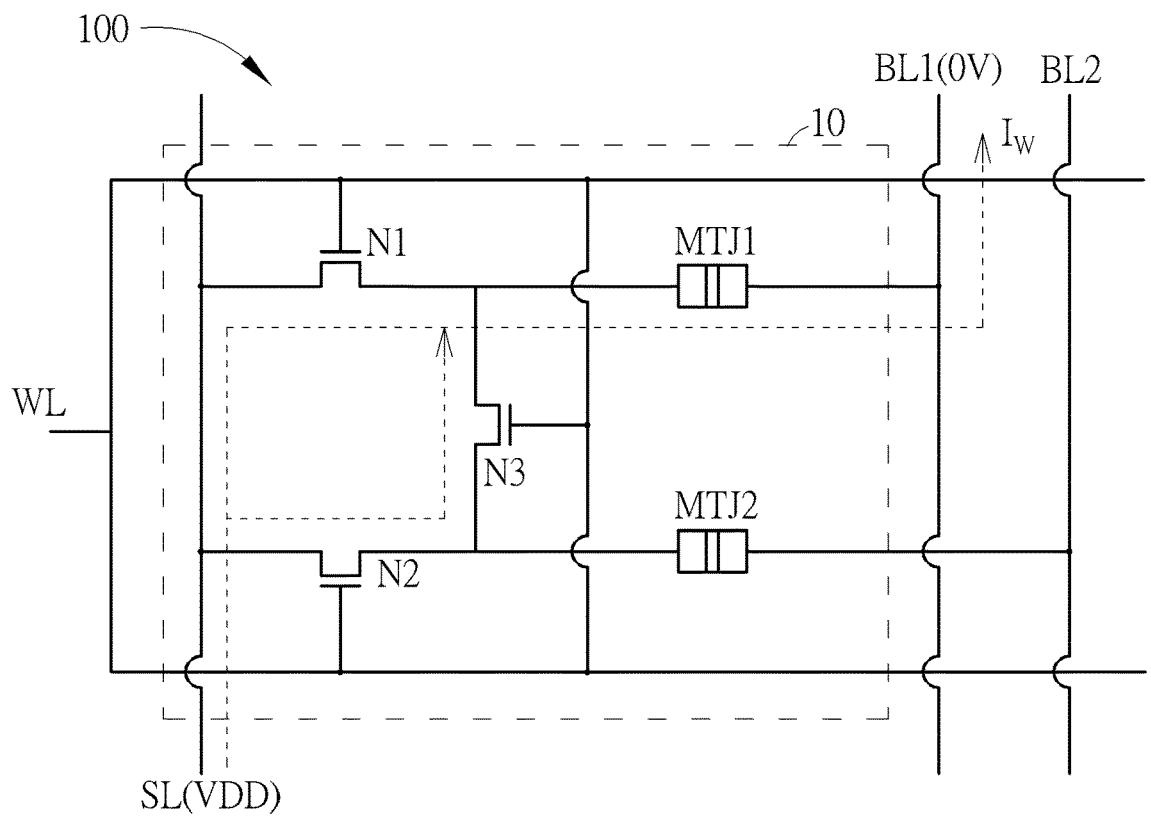
Figure 2A:
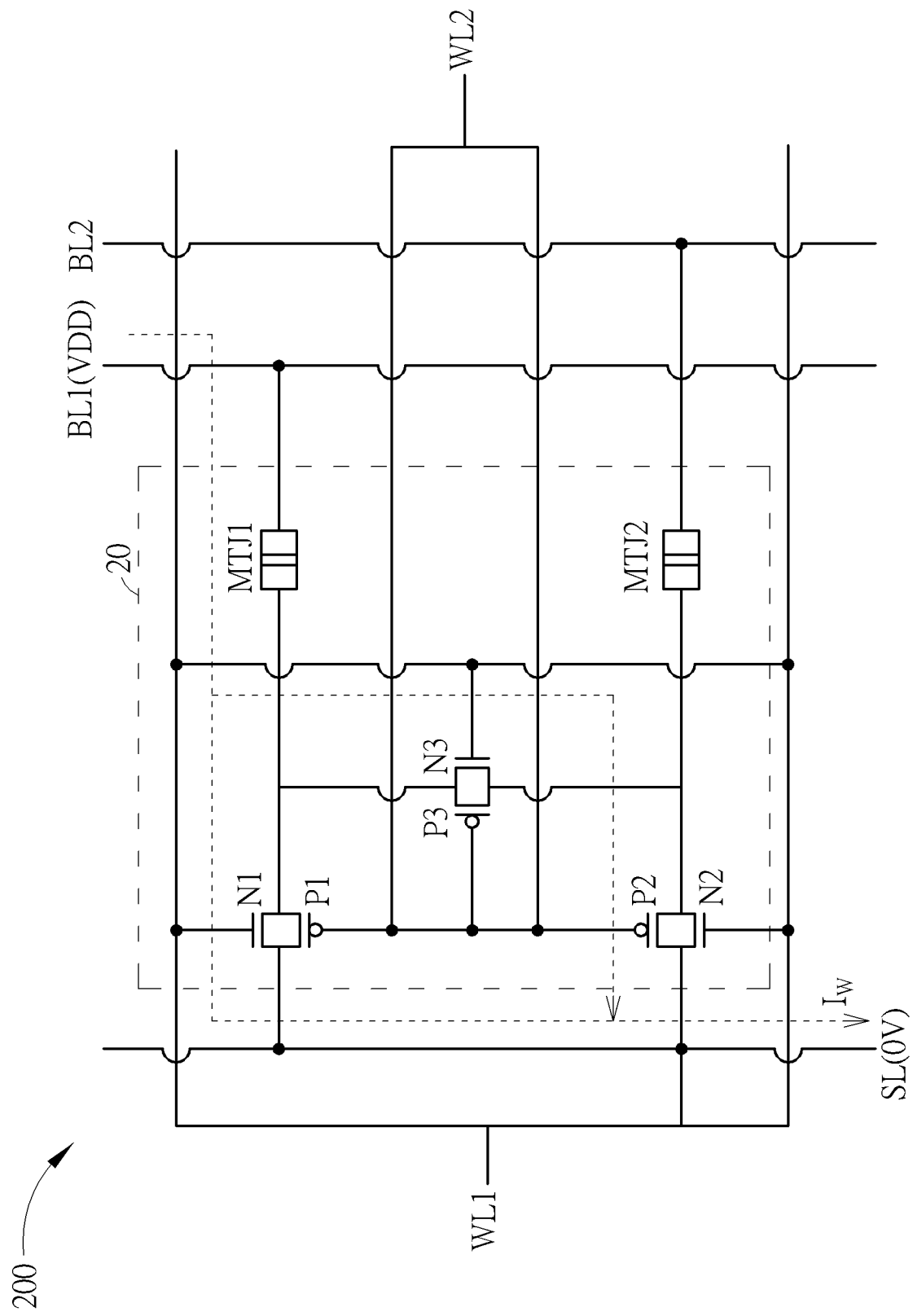
FIGS. 2A and 2B are diagrams illustrating an STT MRAM according to an embodiment of the present invention.
Figure 2B:
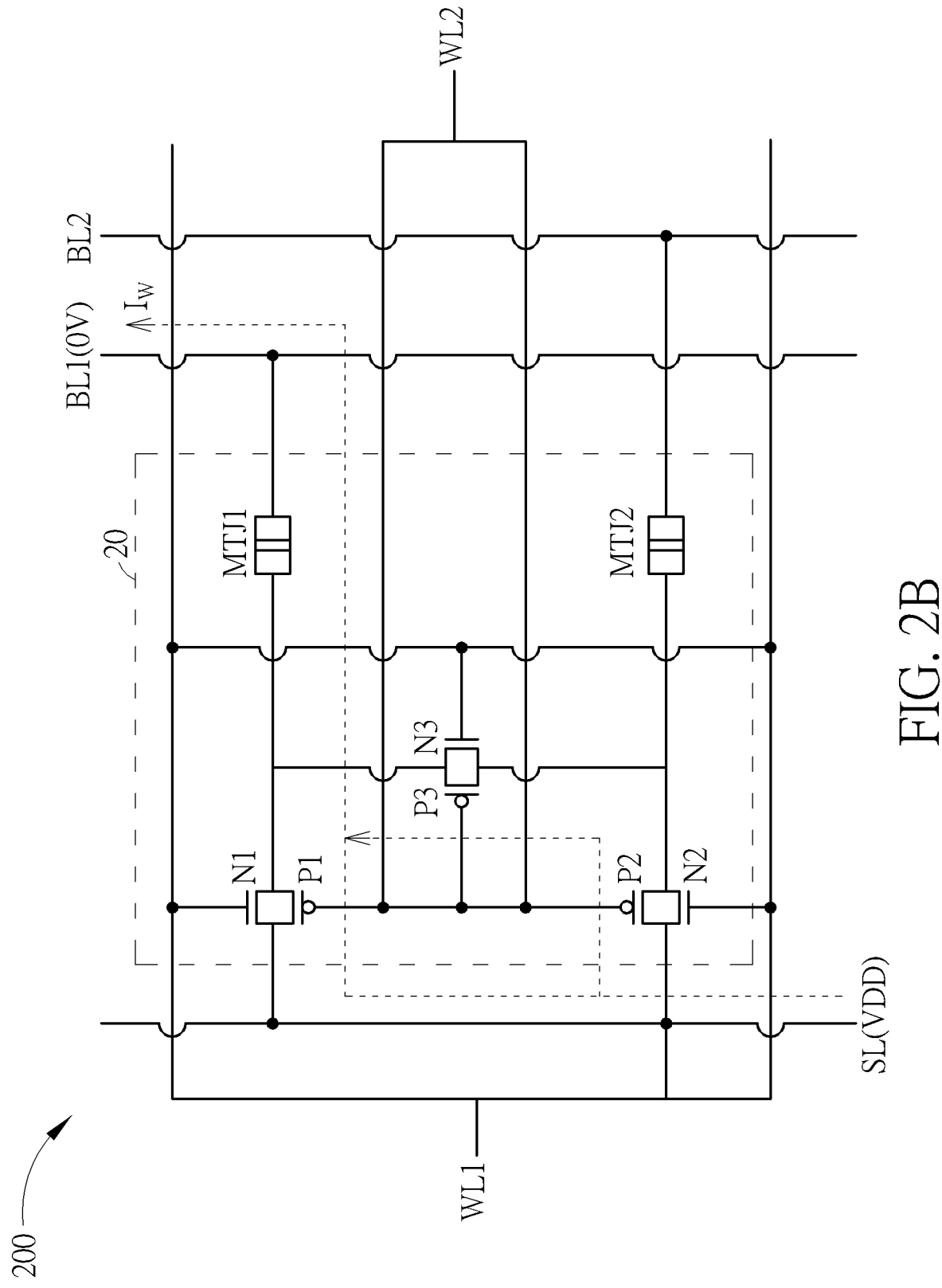

FIGS. 2A and 2B are diagrams illustrating an STT MRAM 200 according to an embodiment of the present invention. The STT MRAM 200 includes a unit cell 20, bit lines BL1-BL2, word lines WL1-WL2, and a source line SL. The unit cell 20 adopts a 6T2M structure which includes six transistors (N-type transistors N1-N3 and P-type transistors P1-P3) and two non-volatile storage units MTJ1 and MTJ2.

The first end of the non-volatile storage unit MTJ1 is coupled to the bit line BL1, and the first end of the non-volatile storage unit MTJ2 is coupled to the bit line BL2. The N-type transistor N1 includes a first end coupled to the second end of the non-volatile storage unit MTJ1, a second end coupled to the source line SL, and a control end coupled to the word line WL1. The N-type transistor N2 includes a first end coupled to the second end of the non-volatile storage unit MTJ2, a second end coupled to the source line, and a control end coupled to the word line WL1. The N-type transistor N3 includes a first end coupled to the first end of the N-type transistor N1, a second end coupled to the first end of the N-type transistor N2, and a control end coupled to the word line WL1. The P-type transistor P1 includes a first end coupled to the second end of the N-type transistor N1, a second end coupled to the first end of the N-type transistor N1, and a control end coupled to the word line WL2. The P-type transistor P2 includes a first end coupled to the second end of the N-type transistor N2, a second end coupled to the first end of the N-type transistor N2, and a control end coupled to the word line WL2. The P-type transistor P3 includes a first end coupled to the second end of the N-type transistor N3, a second end coupled to the first end of the N-type transistor N3, and a control end coupled to the word line WL2.

Figure 3B:
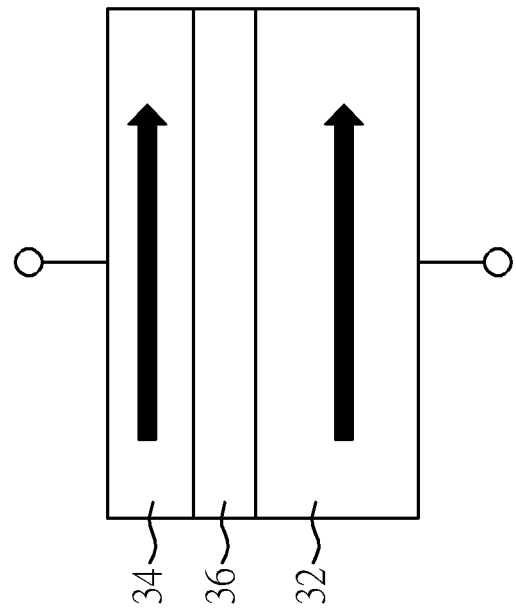
FIGS. 3A and 3B are diagrams illustrating the implementation and data status of each non-volatile storage unit in a unit cell according to an embodiment of the present invention.
Figure 3A:
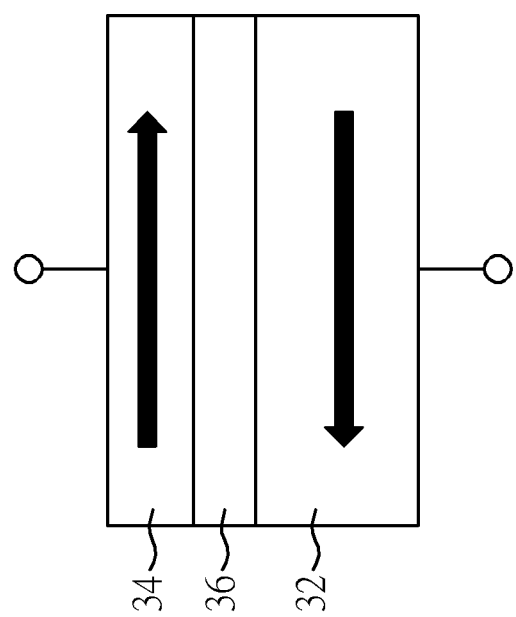

FIGS. 3A and 3B are diagrams illustrating the implementation and data status of each non-volatile storage unit in the unit cell 20 according to an embodiment of the present invention. Each of the non-volatile storage units MTJ1 and MTJ2 includes a data ferromagnetic layer 32, a reference ferromagnetic layer 34, and a tunnel barrier layer 36, wherein the magnetization direction of the data ferromagnetic layer 32 and the reference ferromagnetic layer 34 are represented by arrow symbols. The magnetization direction of the data ferromagnetic layer 32 varies with externally applied magnetic field and may switch between two magnetic states, thereby storing bit information. The reference ferromagnetic layer 34 is made of ferromagnetic material with a fixed magnetic state, and its magnetization direction is unaffected by externally applied magnetic field. The resistance of the tunnel barrier layer 36 is determined by the relationship between the magnetization directions of the data ferromagnetic layer 32 and the reference ferromagnetic layer 34. When the magnetization direction of the data ferromagnetic layer 32 is aligned in an anti-parallel direction with respect to the magnetization direction of the reference ferromagnetic layer 34 after applying a switching pulse signal to the non-volatile storage unit MTJ1 or MTJ2, the tunnel barrier layer 36 is in a high-resistance (RH) state, thereby putting the non-volatile storage unit MTJ1 or MTJ2 in an anti-parallel state as depicted in FIG. 3A. When the magnetization direction of the data ferromagnetic layer 32 is aligned in a parallel direction with respect to the magnetization direction of the reference ferromagnetic layer 34 after applying a switching pulse signal to the non-volatile storage unit MTJ1 or MTJ2, the tunnel barrier layer 56 is in a low-resistance (RL) state, thereby putting the non-volatile storage unit MTJ1 or MTJ2 in a parallel state as depicted in FIG. 3B.

The data stored in the unit cell 20 is defined by the state of its non-volatile storage units MTJ1 and MTJ2. In an embodiment, the unit cell 20 is considered to store logic "1" data when the corresponding non-volatile storage unit MTJ1 or MTJ2 is in the anti-parallel state and is considered to store logic "0" data when the corresponding non-volatile storage unit MTJ1 or MTJ2 is in the parallel state. In another embodiment, the unit cell 20 is considered to store logic "0" data when the corresponding non-volatile storage unit MTJ1 or MTJ2 is in the anti-parallel state and is considered to store logic "1" data when the corresponding non-volatile storage unit MTJ1 or MTJ2 is in the parallel state. However, the definition of the data stored in the unit cell 20 with respect to the state of its non-volatile storage unit MTJ1 or MTJ2 does not limit the scope of the present invention.

In the unit cell 20 of the present invention, each N-type transistor is coupled in parallel with a corresponding P-type transistor. When negatively-charged electrons (the majority carriers of the N-type transistors N1-N3) flow from the source end to the drain end of the N-type transistors N1-N3, positive current flows from the drain end to the source end of the N-type transistors N1-N3. When positively-charged holes (the majority carriers of the P-type transistors P1-P3) flow from the source end to the drain end of the P-type transistors P1-P3, positive current flows from the source end to the drain end of the P-type transistors P1-P3. Therefore, the unit cell 20 of the present invention can provide bi-directional current during the write operation using the transmission gate formed by a pair of N-type and P-type transistors coupled in parallel.

FIG. 2A is a diagram illustrating the operation of writing the non-volatile storage units of the unit cell 20 to the parallel state according to an embodiment of the present invention. During the operation of writing to the parallel state, the bit line BL1 may be biased to a positive voltage VDD (such as 0.8V), the source line SL may be biased to a ground voltage (such as 0V), and the bit line BL2 may be floating. Under such circumstance, the write-in current $I_W$ flows from the bit line BL1 to the source line SL, as depicted by the dotted arrow in FIG. 2A. During the operation of writing to the parallel state, the write-in current $I_W$ is mainly provided by the N-type transistors N1-N3. Since the non-volatile storage unit MTJ1 is located on the drain side of the N-type transistors N1-N3, it does not cause any source degeneration.

FIG. 2B is a diagram illustrating the operation of writing the non-volatile storage units of the unit cell 20 to the anti-parallel state according to an embodiment of the present invention. During the operation of writing to the anti-parallel state, the bit line BL1 may be biased to a ground voltage (such as 0V), the source line SL may be biased to a positive voltage VDD (such as 0.8V), and the bit line BL2 may be floating. Under such circumstance, the write-in current $I_W$ flows from the source line SL to the bit line BL1, as depicted by the dotted arrow in FIG. 2B. During the operation of writing to the anti-parallel state, the write-in current $I_W$ is mainly provided by the P-type transistors P1-P3. Since the non-volatile storage unit MTJ1 is located on the drain side of the P-type transistors P1-P3, it does not cause any source degeneration.

Figure 4:
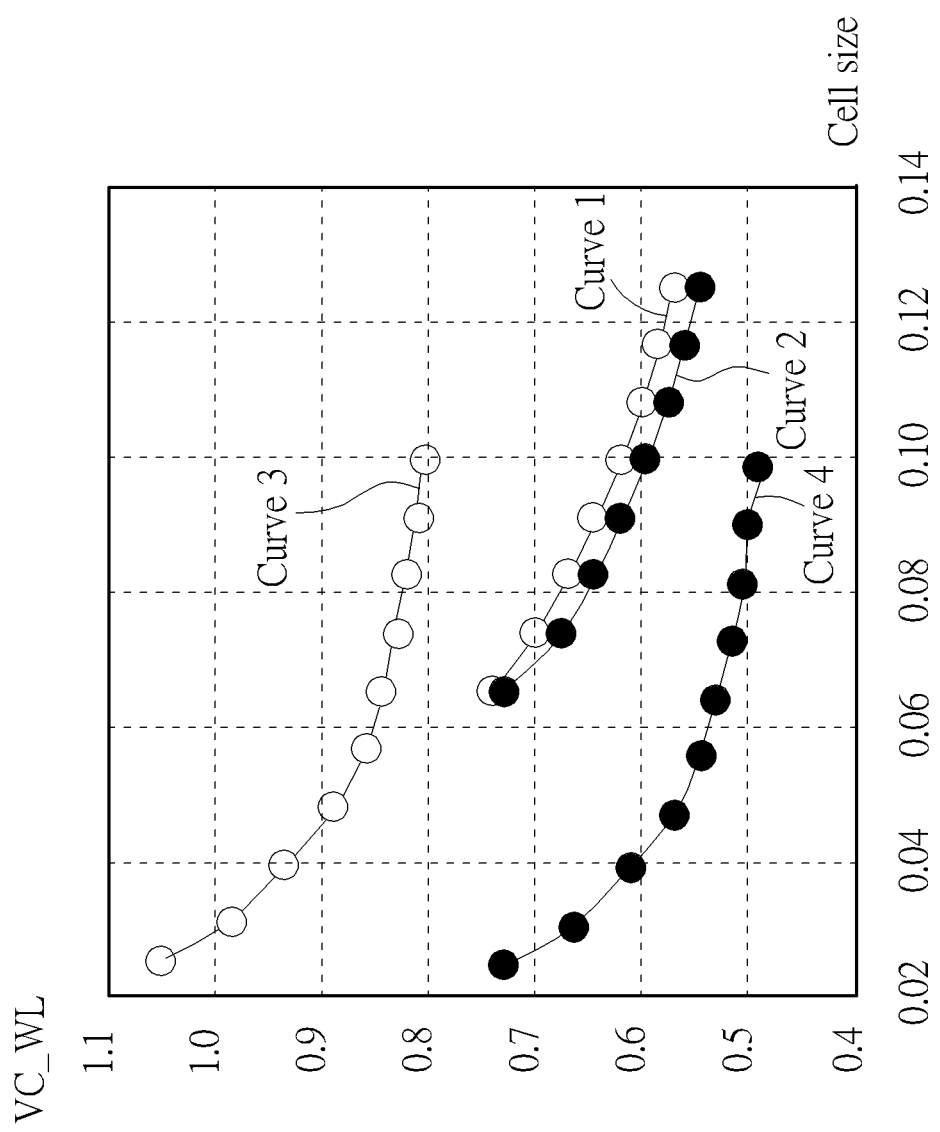
FIG. 4 is a diagram illustrating the write operation of the unit cell according to an embodiment of the present invention.

FIG. 4 is a diagram illustrating the write operation of the unit cell 20 according to an embodiment of the present invention. The vertical axis represents the switching voltage $V_{C\_WL}$ (in Volt) required to reverse the magnetization direction of a non-volatile storage unit in the unit cell 20. The horizontal axis represents the cell size (in $\mu m^2$) of the non-volatile storage unit in the unit cell 20. Curve 1 represents the characteristic curve of the present unit cell 20 (6T2M structure) during the operation of writing to the anti-parallel state. Curve 2 represents the characteristic curve of the present unit cell 20 (6T2M structure) during the operation of writing to the parallel state. Curve 3 represents the characteristic curve of the prior art unit cell 10 (3T2M structure) during the operation of writing to the anti-parallel state. Curve 4 represents the characteristic curve of the prior art unit cell 10 (3T2M structure) during the operation of writing to the parallel state. As depicted by Curve 1 and Curve 3, with the same cell size, the present invention may adopt a smaller switching voltage $V_{C\_WL}$ for reversing the magnetization direction of the non-volatile storage units in the unit cell 20.

Figure 5:
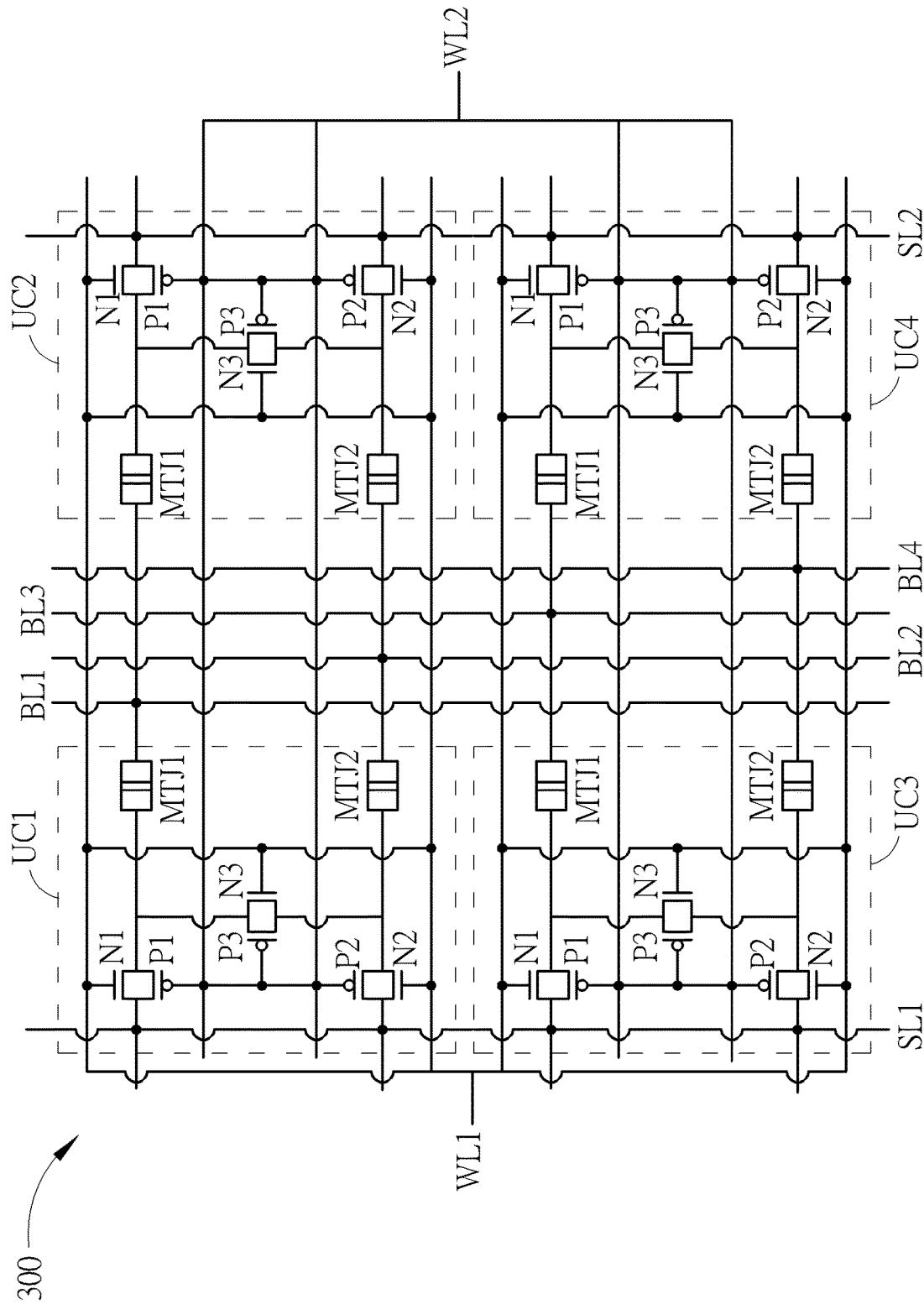
FIG. 5 is a diagram illustrating an STT MRAM according to an embodiment of the present invention.

FIG. 5 is a diagram illustrating an STT MRAM 300 according to an embodiment of the present invention. The STT MRAM 300 includes M*N unit cells 20, bit lines $BL_1$-$BL_{2M}$, word lines $WL_1$-$WL_N$, and source lines $SL_1$-$SL_M$, wherein M and N are positive integers. For illustrative purpose, FIG. 5 depicts the embodiment of M=N=2. However, the number of the unit cells, the bit lines, the word lines or the source lines does not limit the scope of the present invention. In FIG. 5, the unit cells in the STT MRAM 300 are designated by UC1-UC4, and each unit cell may be implemented using the 6T2M structure depicted in FIGS. 2A and 2B.

In the STT MRAM 300 of the present invention, two adjacent unit cells along the left-to-right direction (perpendicular to the direction of the bit lines) may share two bit lines. For example, the first ends of the non-volatile storage units MTJ1 in the unit cells UC1 and UC2 are coupled to the bit line BL1, the first ends of the non-volatile storage units MTJ2 in the unit cells UC1 and UC2 are coupled to the bit line BL2, the first ends of the non-volatile storage units MTJ1 in the unit cells UC3 and UC4 are coupled to the bit line WBL3, and the first ends of the non-volatile storage units MTJ2 in the unit cells UC3 and UC4 are coupled to the bit line BL4.

In the STT MRAM 300 of the present invention, two adjacent unit cells along the top-to-bottom direction (parallel to the direction of the bit lines) may share the same word line. For example, the control ends of the N-type transistors N1-N3 in the unit cells UC1-UC4 are coupled to the word line WL1, and the control ends of the P-type transistors P1-P3 in the unit cells UC1-UC4 are coupled to the word line WL2.

Figure 6:
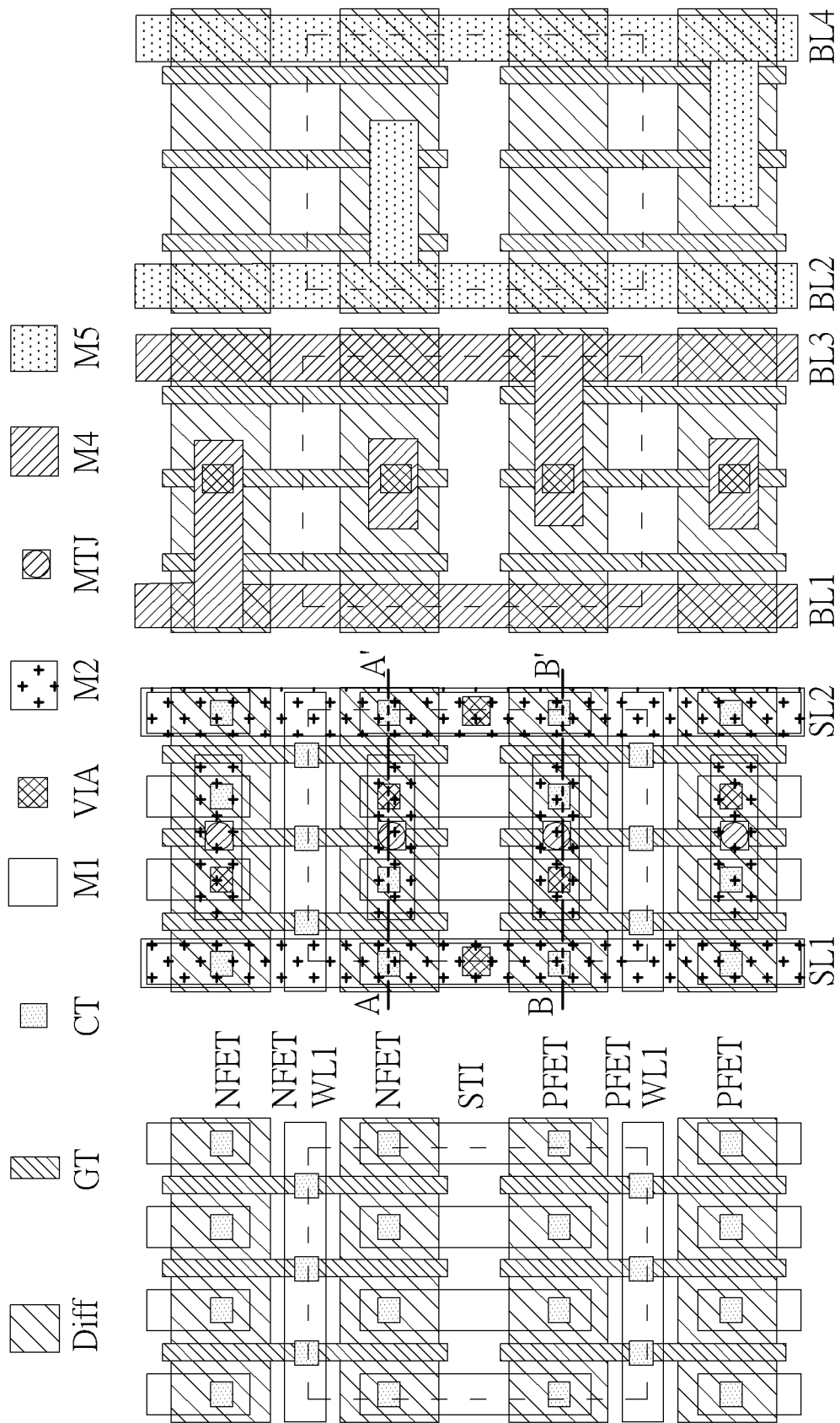
FIG. 6 is a layout diagram illustrating an implementation of the STT MRAM according to an embodiment of the present invention.
Figure 7:
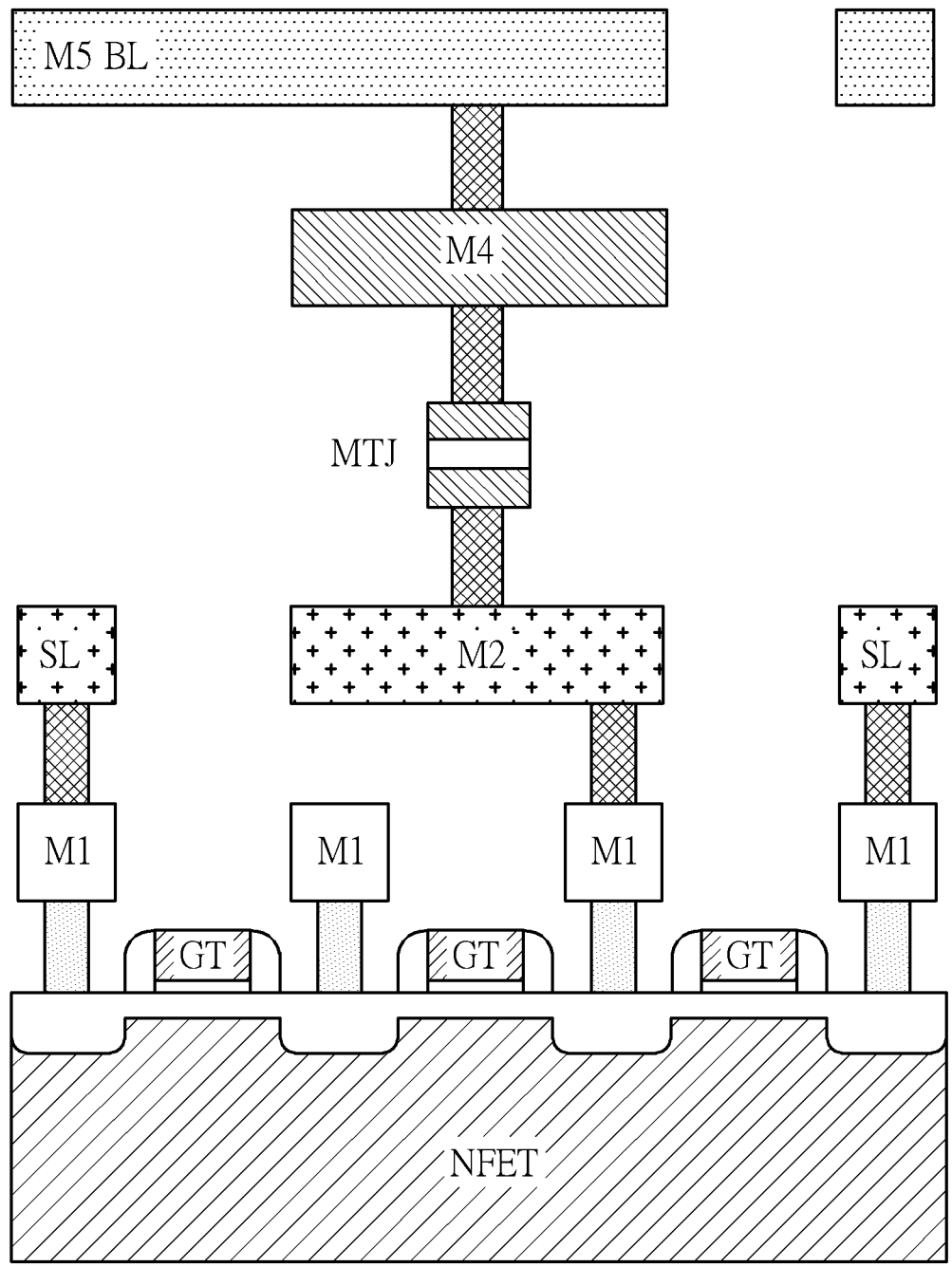
FIG. 7 is a cross-sectional diagram of the STT MRAM along a cutting line A-A' according to an embodiment of the present invention.
Figure 8:
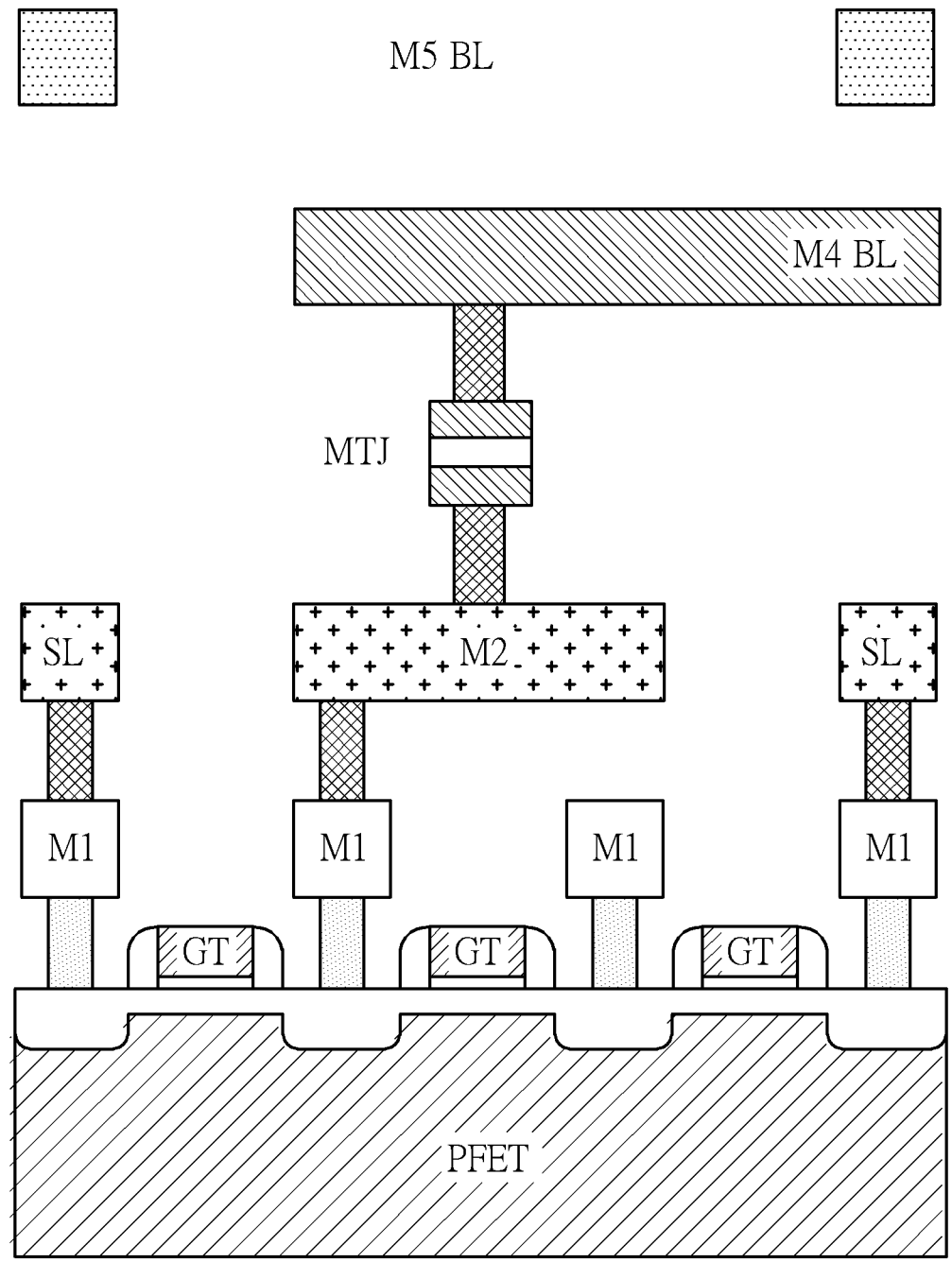
FIG. 8 is a cross-sectional diagram of the STT MRAM along a cutting line B-B' according to an embodiment of the present invention.

FIG. 6 is a layout diagram illustrating an implementation of the STT MRAM 300 according to an embodiment of the present invention. FIG. 7 is a cross-sectional diagram of the STT MRAM 300 along a cutting line A-A' according to an embodiment of the present invention. FIG. 8 is a cross-sectional diagram of the STT MRAM 300 along a cutting line B-B' according to an embodiment of the present invention. Diff represents doping regions (P-type doping regions or N-type doping regions). GT represent the poly-silicon layer serving as gate. CT represents contact points. M1 represent the metal layer serving as word lines. VIA represents the electrical connection between layers. M2 represent the metal layer serving as source lines. MTJ represent the non-volatile storage units. M4 and M5 represent the metal layer serving as bit lines.

In conclusion, the present invention provides a 6T2M STT MRAM in which each N-type transistor is coupled in parallel with a corresponding P-type transistor. Using the transmission gate formed by a pair of N-type and P-type transistors coupled in parallel, bi-directional current may be provided during the write operation for preventing source degeneration, wherein the write-in current is mainly provided by the N-type transistors during the operation of writing to the parallel state and the write-in current is mainly provided by the PN-type transistors during the operation of writing to the anti-parallel state. Therefore, the present STT MRAM can improve the writing speed and requires a lower switching voltage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A magnetoresistive random-access memory (MRAM), comprising:
   a first bit line;
   a second bit line; and
   a first unit cell, comprising:
      a first non-volatile storage unit, comprising:
         a first end coupled to the first bit line; and
         a second end;
      a second non-volatile storage unit, comprising:
         a first end coupled to the second bit line; and
         a second end;
      a first N-type transistor, comprising:
         a first end coupled to the second end of the first non-volatile storage unit;
         a second end; and
         a control end;

a second N-type transistor, comprising:
  a first end coupled to the second end of the second non-volatile storage unit;
  a second end; and
  a control end;
a third N-type transistor, comprising:
  a first end coupled to the first end of the first N-type transistor;
  a second end coupled to the first end of the second N-type transistor; and
  a control end;
a first P-type transistor, comprising:
  a first end coupled to the second end of the first N-type transistor;
  a second end coupled to the first end of the first N-type transistor; and
  a control end;
a second P-type transistor, comprising:
  a first end coupled to the second end of the second N-type transistor;
  a second end coupled to the first end of the second N-type transistor; and
  a control end; and
a third P-type transistor, comprising:
  a first end coupled to the second end of the third N-type transistor;
  a second end coupled to the first end of the third N-type transistor; and
  a control end.

2. The MRAM of claim 1, wherein:
the control end of the first N-type transistor, the control end of the second N-type transistor and the control end of the third N-type transistor are coupled to a first word line; and
the control end of the first P-type transistor, the control end of the second P-type transistor and the control end of the third P-type transistor are coupled to a second word line.

3. The MRAM of claim 1, further comprising a second unit cell which comprises:
a third non-volatile storage unit, comprising:
  a first end coupled to the first bit line; and
  a second end;
a fourth non-volatile storage unit, comprising:
  a first end coupled to the second bit line; and
  a second end;
a fourth N-type transistor, comprising:
  a first end coupled to the second end of the third non-volatile storage unit;
  a second end; and
  a control end;
a fifth N-type transistor, comprising:
  a first end coupled to the second end of the fourth non-volatile storage unit;
  a second end; and
  a control end;
a sixth N-type transistor, comprising:
  a first end coupled to the first end of the fourth N-type transistor;
  a second end coupled to the first end of the fifth N-type transistor; and
  a control end;
a fourth P-type transistor, comprising:
  a first end coupled to the second end of the fourth N-type transistor;
  a second end coupled to the first end of the fourth N-type transistor; and
  a control end;
a fifth P-type transistor, comprising:
  a first end coupled to the second end of the fifth N-type transistor;
  a second end coupled to the first end of the fifth N-type transistor; and
  a control end; and
a sixth P-type transistor, comprising:
  a first end coupled to the second end of the sixth N-type transistor;
  a second end coupled to the first end of the sixth N-type transistor; and
  a control end.

4. The MRAM of claim 3, wherein:
the control end of the first N-type transistor, the control end of the second N-type transistor, the control end of the third N-type transistor, the control end of the fourth N-type transistor, the control end of the fifth N-type transistor and the control end of the sixth N-type transistor are coupled to a first word line; and
the control end of the first P-type transistor, the control end of the second P-type transistor, the control end of the third P-type transistor, the control end of the fourth P-type transistor, the control end of the fifth P-type transistor and the control end of the sixth P-type transistor are coupled to a second word line.

5. The MRAM of claim 3, wherein:
the second end of the first N-type transistor and the second end of the second N-type transistor are coupled to a first source line; and
the second end of the fourth N-type transistor and the second end of the fifth N-type transistor are coupled to a second source line.

6. The MRAM of claim 1, further comprising:
a third bit line;
a fourth bit line; and
a third unit cell, comprising:
  a fifth non-volatile storage unit, comprising:
    a first end coupled to the third bit line; and
    a second end;
  a sixth non-volatile storage unit, comprising:
    a first end coupled to the fourth bit line; and
    a second end;
  a seventh N-type transistor, comprising:
    a first end coupled to the second end of the fifth non-volatile storage unit;
    a second end; and
    a control end;
  an eighth N-type transistor, comprising:
    a first end coupled to the second end of the sixth non-volatile storage unit;
    a second end; and
    a control end;
  a ninth N-type transistor, comprising:
    a first end coupled to the first end of the seventh N-type transistor;
    a second end coupled to the first end of the eighth N-type transistor; and
    a control end;
  a seventh P-type transistor, comprising:
    a first end coupled to the second end of the seventh N-type transistor;
    a second end coupled to the first end of the seventh N-type transistor; and
    a control end;
  an eighth P-type transistor, comprising:

a first end coupled to the second end of the eighth N-type transistor;
a second end coupled to the first end of the eighth N-type transistor; and
a control end; and
a ninth P-type transistor, comprising:
a first end coupled to the second end of the ninth N-type transistor;
a second end coupled to the first end of the ninth N-type transistor; and
a control end.

7. The MRAM of claim 6, wherein:
the control end of the first N-type transistor, the control end of the second N-type transistor, the control end of the third N-type transistor, the control end of the seventh N-type transistor, the control end of the eighth N-type transistor and the control end of the ninth N-type transistor are coupled to a first word line; and
the control end of the first P-type transistor, the control end of the second P-type transistor, the control end of the third P-type transistor, the control end of the seventh P-type transistor, the control end of the eighth P-type transistor and the control end of the ninth P-type transistor are coupled to a second word line.

8. The MRAM of claim 6, wherein:
the second end of the first N-type transistor, the second end of the second N-type transistor, the second end of the seventh N-type transistor and the second end of the eighth N-type transistor are coupled to a source line.

9. A magnetoresistive random-access memory (MRAM), comprising:
an N-type doping region formed in a substrate;
a P-type doping region formed in the substrate;
a poly-silicon layer formed on the substrate;
a first metal layer formed on the substrate;
a second metal layer formed above the first metal layer;
a first non-volatile storage unit disposed above the second metal layer and located on a first reference line;
a second non-volatile storage unit disposed above the second metal layer and located on a second reference line parallel to the first reference line;
a third metal layer formed above the first non-volatile storage unit and the second non-volatile storage unit; and
a fourth metal layer formed above the third metal layer.

10. The MRAM of claim 9, further comprising:
an N-type transistor, comprising:
a first end formed in the N-type doping region;
a second end formed in the N-type doping region; and
a control end formed on the substrate at a location corresponding to a first channel;
a P-type transistor, comprising:
a first end formed in the P-type doping region;
a second end formed in the P-type doping region; and
a control end formed on the substrate at a location corresponding to a second channel;
a word line formed in the first metal layer;
a source line formed in the second metal layer;
a first bit line formed in the third metal layer and the fourth metal layer; and
a second bit line formed in the third metal layer and the fourth metal layer.

11. The MRAM of claim 10, further comprising:
a first via formed between the third metal layer and first non-volatile storage unit for electrically connecting the first bit line to the first non-volatile storage unit; and
a second via formed between the third metal layer and second non-volatile storage unit for electrically connecting the second bit line to the second non-volatile storage unit.

* * * * *